United States Patent [19]

Kurose et al.

[11] Patent Number: 4,918,513
[45] Date of Patent: Apr. 17, 1990

[54] SOCKET FOR AN INTEGRATED CIRCUIT CHIP CARRIER AND METHOD FOR PACKAGING AN INTEGRATED CIRCUIT CHIP

[75] Inventors: Mitsukazu Kurose; Masahiro Minowa, both of Suwa, Japan

[73] Assignee: Seiko Epson Corporation, Tokyo, Japan

[21] Appl. No.: 201,978

[22] Filed: Jun. 3, 1988

[30] Foreign Application Priority Data

| Jun. 5, 1987 | [JP] | Japan | 62-140973 |
| Jun. 5, 1987 | [JP] | Japan | 62-140976 |
| Sep. 29, 1987 | [JP] | Japan | 62-245536 |
| Sep. 30, 1987 | [JP] | Japan | 62-247470 |

[51] Int. Cl.$^4$ .......................................... H01L 23/10
[52] U.S. Cl. .................................. 357/74; 357/79
[58] Field of Search .............. 357/74, 79; 439/345, 439/368; 174/52.4

[56] References Cited

U.S. PATENT DOCUMENTS

| 4,144,648 | 3/1979 | Grovender | 439/345 |
| 4,381,131 | 4/1983 | Demnianiuk | 357/79 |
| 4,692,790 | 9/1987 | Oyamada | 357/74 |

Primary Examiner—James W. Davie
Attorney, Agent, or Firm—Blum Kaplan

[57] ABSTRACT

An IC chip socket for receiving an IC bare chip carrier includes a guide member for guiding the periphery of the IC chip carrier. The guide member supports a plurality of connector pins having one end projecting within the guide member and another end projecting without the guide member. The connector pins electrically connect the electrodes of the chip carrier to the electronic circuit substrate. The respective ends of the connector pins projecting within the guide member are brought into contact with the electrodes of the IC chip carrier. The ends of the connector pins which project without the guide member are connectable with the electrodes mounted on the surface of the electronic circuit substrate.

29 Claims, 5 Drawing Sheets

FIG. 5
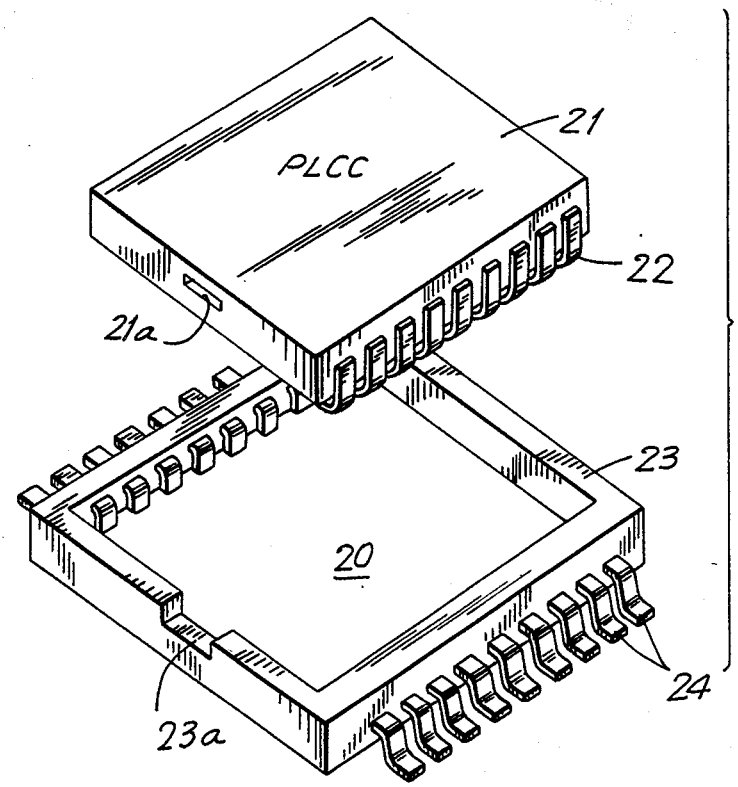
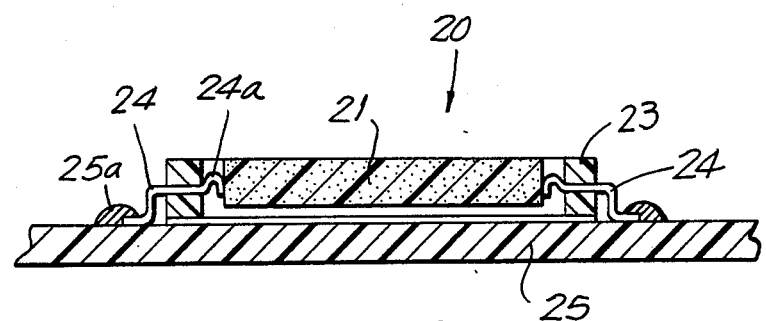
FIG. 6

SOCKET FOR AN INTEGRATED CIRCUIT CHIP CARRIER AND METHOD FOR PACKAGING AN INTEGRATED CIRCUIT CHIP

BACKGROUND OF THE INVENTION

This invention relates to a packaging method for the fixed mounting of an integrated circuit chip on an electronic circuit board, and in particular, to a packaging method which allows for the replacement of an integrated circuit chip carrier on an electronic circuit board utilizing a surface mounted integrated circuit chip socket in a microelectronic apparatus.

In the conventional practice, the electronic components are packaged so that integrated circuit (IC) chips were mounted in small spaces by directly bonding the IC chips by soldering mini flat packages or soldering chip carriers of the lead-less type directly to the surface of a circuit board. This packaging method has been less than satisfactory in that when dealing with components such as ROMs which have unchangeable contents, a comparatively large part of the circuit board must be replaced with a new section when a program stored in the ROM is to be altered. Additionally, the circuit board must be replaced in its entirety when chips become defective leading to an increase in the cost of electronic apparatus.

Other conventional methods make use of a flat package type of socket. This socket has also been less than satisfactory because in attaching an IC of the flat package type to a socket, a large packaging area must be utilized therefore making it unfit for a microelectronic apparatus.

Accordingly, it is desirable to provide a socket and method for packaging an IC chip which overcomes the shortcomings of the prior art devices described above.

SUMMARY OF THE INVENTION

Generally speaking, in accordance with the invention, an arrangement for packaging a chip carrier substrate is provided. The chip carrier substrate includes a small sized substrate having an electrode pattern disposed on its surface. An IC bearing chip is mounted on the small sized substrate and is connected with the electrode pattern. A mold layer is provided to cover the IC bearing chip. A guide member having an IC chip socket therein is composed of a plurality of connector pins which are brought into contact with and electrically connected with the electrode pattern of the chip carrier substrate. The guide member supports the connector pins and guides the periphery of the chip carrier substrate to properly position the IC chip substrate structure.

The IC chip is packaged by bringing respective ends of the connector pins which project within the guide member into contact with the electrodes of the chip carrier substrate. The other ends of the connector pins which project without the guide member are connected with an electrode pattern which is mounted on the surface of an electronic circuit substrate allowing the chip carrier substrate to be interchangeably mounted while the IC chip socket is fixedly mounted to the surface of the electronic circuit substrate.

The IC socket is adapted to receive an IC bearing chip carrier of the lead-less type or the type including leads. A guide member for guiding the periphery of the chip carrier supports a plurality of connector pins which connect the electrodes of the chip carrier with the electrodes of an electronic circuit substrate. One end of each connector pin projects within the guide member and is brought into contact with the electrodes of the chip carrier and the other end of each connector pin projects without the guide member and is arranged to be surface mounted to the electrodes provided on the surface of the electronic circuit substrate.

Accordingly, it is an object of this invention to provide an improved IC socket for an IC chip carrier.

Another object of the invention is to provide an improved method for packaging an IC chip.

Yet another object of the invention is to provide a method for packaging an IC chip in a microelectronic apparatus so that it is both interchangable and fixed while utilizing a small packaging area which need not be destroyed when replacing IC chips.

Still other objects and advantages of the invention will in part be obvious and will in part be apparent from the specification and drawings.

The invention accordingly comprises the several steps in the relation of one or more such steps with respect to each of the others and the article possessing features, properties and relation of elements which are exemplified in the following detailed disclosure, and the scope of the invention will be indicated in the claims.

DESCRIPTION OF THE DRAWINGS

For a fuller understanding of the invention, reference is had to the following description, taken in connection with the accompanying drawings, in which:

FIG. 5 is an exploded view of a second embodiment of an IC chip socket and IC chip carrier in accordance with the present invention;

FIG. 6 is a cross sectional view of the assembled IC chip carrier and socket of FIG. 5 in accordance with the second embodiment of the invention;

DETAILED DESCRIPTION OF THE PREFERRED EMBODIMENTS

Figure 1:
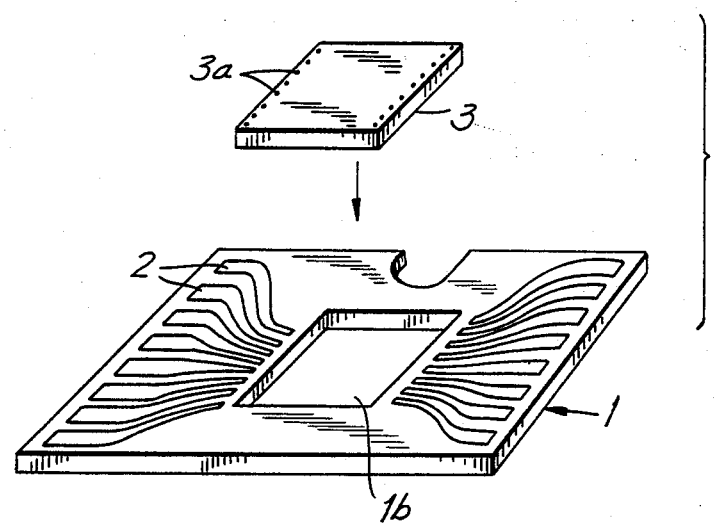
FIG. 1 is an exploded diagram of an IC bearing chip and chip carrier substrate in accordance with the present invention.
Figure 2:
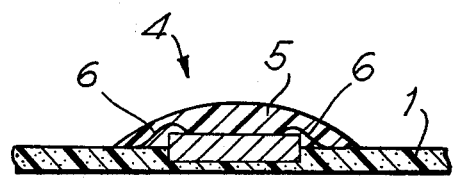
FIG. 2 is a cross sectional view of the assembled IC chip carrier substrate and IC chip of FIG. 1 in accordance with the invention.

Reference is first made to FIGS. 1 and 2 in which an example of a chip carrier substrate, generally indicated as 1, usable in conjunction with an IC chip socket in accordance with the present invention is provided. Chip carrier substrate 1 is of a small size and may be made of glass epoxy resins or the like. An electrode pattern 2 is formed on the surface of chip carrier substrate 1. Chip carrier substrate 1 is formed with a groove forming a chip mounting portion 1b for receiving an IC bearing chip 3 so that IC bearing chip is secured within chip mounting portion 1b.

Bonding pads 3a are formed on IC bearing chip 3. Bonding wires 6 or the like are used to connect bonding pads 3a with electrode pattern 2 of chip carrier substrate 1 when IC bearing chip 3 is placed within substrate 1. A mold layer 5 is, provided on chip carrier substrate 1 encasing IC bearing chip 3 and bonding wires 6. Chip carrier substrate 1, IC bearing chip 3 and mold layer 5 constitute a chip carrier 4.

Figure 3:
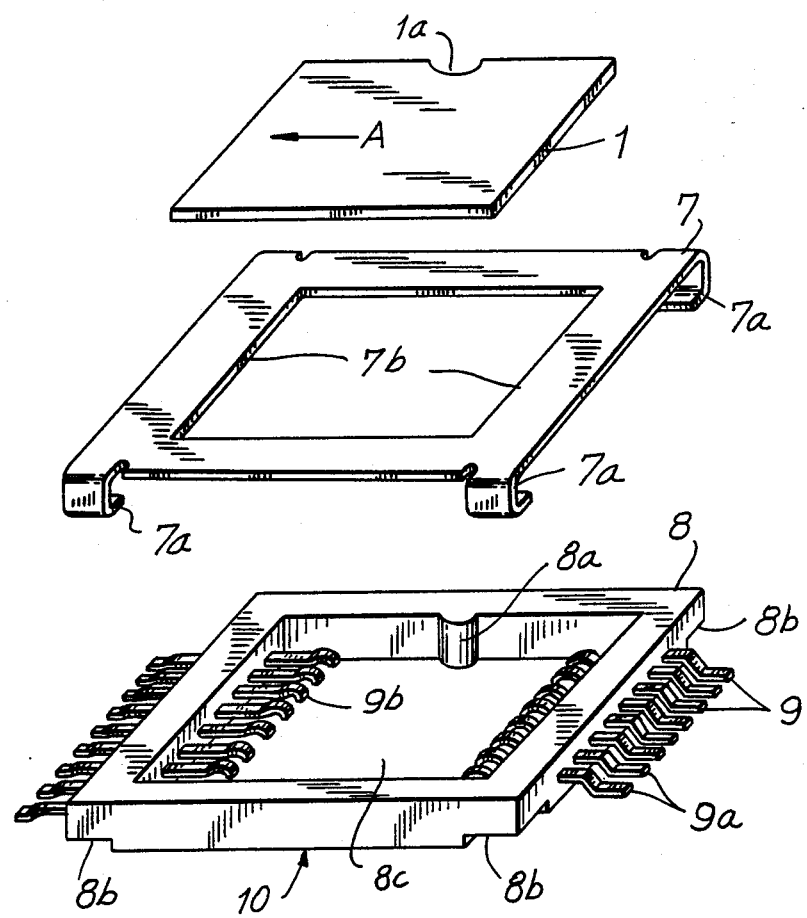
FIG. 3 is an exploded diagram of a first embodiment of an IC bearing chip carrier and an IC chip socket in accordance with the present invention.
Figure 4:
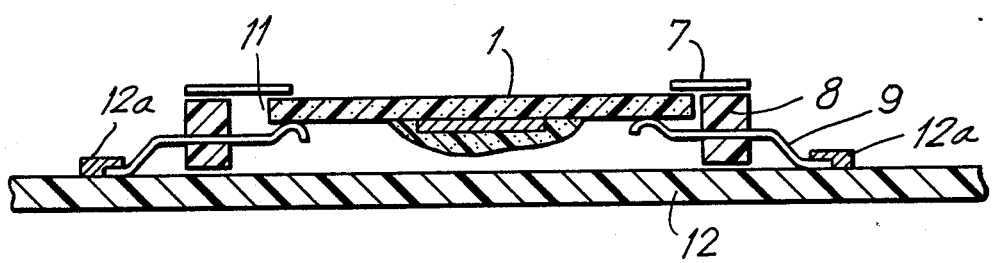
FIG. 4 is a sectional view of an assembled chip carrier and socket of FIG. 3 in accordance with the invention.

Reference is now made to FIGS. 3 and 4 wherein an IC socket, generally indicated as 10, is provided. IC socket 10 includes a guide member 8 which is formed in the shape of a frame with an opening 8c therein which acts as a guide for guiding and receiving chip carrier substrate 1. Guide member 8 supports connector pins 9 formed as terminals projecting within and without guide member 8. The inside terminal portions 9b of connector pins 9 are brought into contact with and connect with electrodes 2 of chip carrier substrate 1. Outside terminal portions 9a of connector pins 9 are connected, by soldering or the like, with an electrode pattern of an electronic circuit substrate (not shown). Connector pins 9 are made of a resilient conductive material so that a reliable connection is provided by pushing chip carrier substrate 1 in the direction of pins 9.

An abutment member 7 is formed with a central opening 7b and folded abutment self-locking tabs 7a on either outer side thereof. Abutment member 7 is mounted on guide member 8 and pushes chip carrier substrate 1 down against connector pins 9. Curcuit substrate 1 is placed so that the surface electrodes 2 and IC bearing chip 3 facing towards the electronic circuit substrate. Abutment member 7 pushes chip carrier substrate 1 from the back. Abutment member 7 is formed of a metal plate such as stainless steel and is secured to guide member 8 by self-locking tabs 7a which extends into and cooperate with notch portions 8b formed on corresponding lower corners of guide member 8.

Chip carrier substrate 1 is mounted within IC chip socket 10 by inserting (sliding) chip carrier substrate 1 through opening 7b in the direction of arrow A and is secured in place by the biasing force of the resilient connector pins 9 pressing chip carrier substrate 1 against abutment member 7. When chip carrier substrate 1 is to be changed or replaced, it can be easily removed through a similar procedure to the mounting procedure described above.

A convex portion 8a is provided on the periphery of opening 8c of guide member 8 and engages with a concave portion 1a formed on chip carrier substrate 1. Convex portion 8a and concave portion 1a are asymmetric in a transverse plane thus serving as positioning portions preventing the erroneous positioning of chip carrier substrate 1.

Reference is made to FIG. 4 wherein a sectional view showing chip carrier substrate 1 mounted within IC chip socket 10 is provided. IC chip socket 10 including guide member 8 is secured to an electronic circuit substrate 12, such as a board or flexible printed circuit, by solder 12a applied to the electrode pattern of electronic circuit substrate 12. Chip carrier substrate 1 is biased by connector pins 9 against abutment member 7 so that it is secured therebetween. A gap 11 present between guide member 8 and chip carrier substrate 1 allows for easy removal of chip carrier substrate 1 from socket 10 through sliding in a reverse action to that described above.

Although this first embodiment utilizes an arrangement wherein chip carrier substrate 1 can be mounted and removed through sliding, another arrangement may also be employed wherein abutment plate 7 is secured by a snap fit to guide member 8. Therefore, chip carrier substrate 1 becomes interchanged by detaching abutment plate 7 so that it acts as an abutment cap. Again, abutment member 7 is formed as a metal plate.

Reference is now made to FIGS. 5 and 6 wherein a second embodiment of the IC chip socket, generally indicated as 20, is provided. An IC chip carrier 21 has leads forming electrodes 22 on the periphery thereof and is formed of molded plastic to define a plastic lead chip carrier (generally designated as a PLCC). The IC chip supported by the PLCC is completely encapsulated in plastic.

IC chip socket 20 includes a frame shaped guide member 23 having connector pins 24 extending therethrough which, in a manner similar to IC chip socket 10, are brought into contact with electrodes 22 of PLCC 21 within guide member 23. The principal difference between IC chip sockets 10 and 20 is that the electrodes 22 on IC chip carriers 21 are on the periphery and the inner portions 24a of connector pins 24 are bent to a hook shape to provide a resilient contact with electrodes 22 and support for PLCC 21. The portion of connector pins 24 which extend without guide member 23 define individual terminal mounting portions. A notch 23a is provided within guide member 23 and aligns itself with a hole 21a formed in the side of PLCC 21 so that a screwdriver or the like may be inserted therethrough to remove PLCC 21.

As seen in FIG. 6, PLCC 21 is mounted through IC chip socket 20 to an electronic circuit substrate 25. The portion of connector pins 24 which extend without IC chip socket 20 are mounted to the surface of electronic circuit substrate 25 through solder 25a. PLCC 21 is biased at its sides by inner portions 24a of connector pins 24 thereby securing PLCC 21 in place with a tension fit so that it does not fall out of IC chip socket 21 even during vibration.

Figure 7:
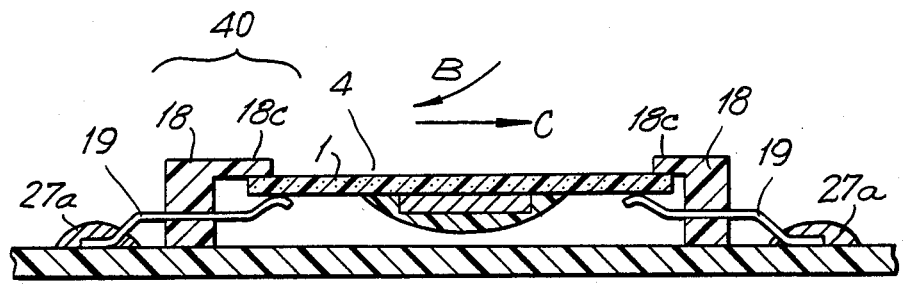
FIG. 7 is a cross sectional view of an assembled IC chip socket and chip carrier in accordance with a third embodiment of the present invention.

Reference is now made to FIG. 7 wherein a third embodiment of the IC socket, generally indicated as 40, is provided. A single guide member 18 acts as both the guide member and the abutment member of IC chip socket 40 for chip carrier 4. Like numerals of socket 10 are used to indicate like parts.

Abutment portions 18c are integrally formed on guide member 18 which is formed of plastic. Abutment portion 18c, secures and releases chip carrier 4 against the bias of connector pins 19. To increase the strength of the plastic, glass fiber may be mixed therein.

When securing chip carrier 1 in place, chip carrier 1 is inserted through opening 18b in abutment portion 18c in the direction of arrow B and shifted in the direction of arrow C so that chip carrier substrate 1 is pinched between connector pins 19 and abutment portion 18c to be secured in place.

Figure 8:
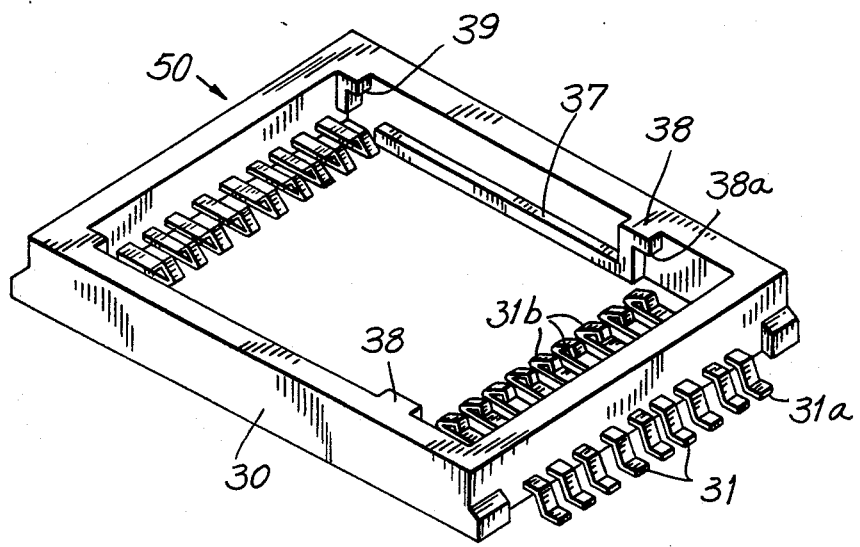
FIG. 8 is a perspective view of an IC chip socket in accordance with a fourth embodiment of the invention.
Figure 9:
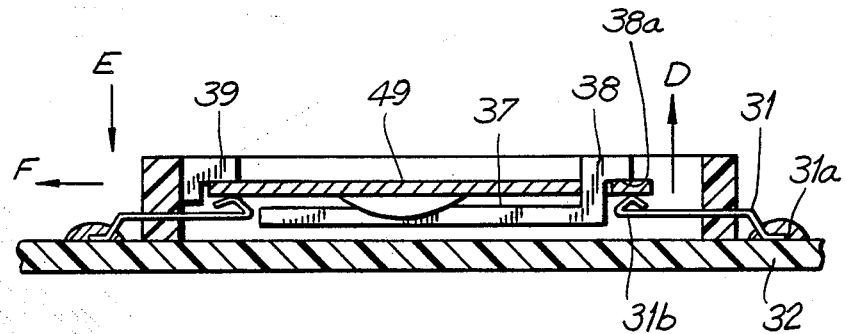
FIG. 9 is a sectional view of a mounted IC chip carrier in the IC chip socket of FIG. 8 in accordance with the fourth embodiment of the invention.
Figure 10:
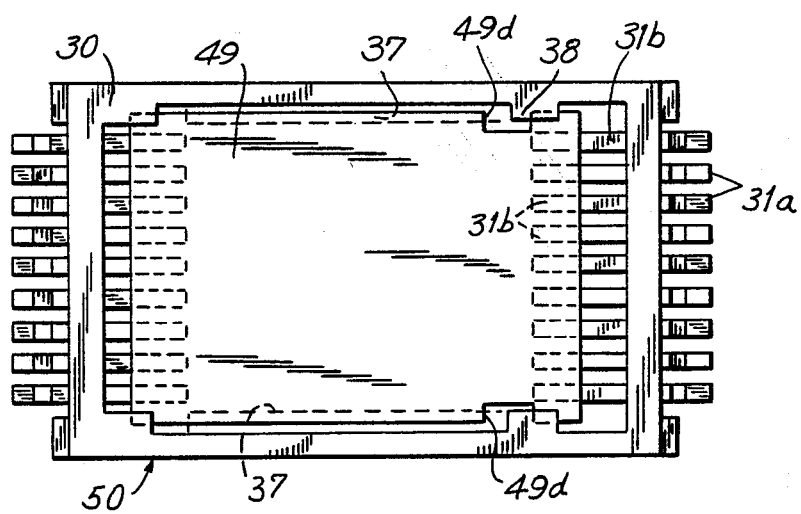
FIG. 10 is a top plan view of the IC chip socket in accordance with the fourth embodiment of the invention.

Reference is now made to FIGS. 8, 9 and 10 wherein an IC chip socket, generally indicated as 50, in accordance with a fourth embodiment of the invention is provided. A guide member 30 guides the periphery of a chip carrier 49. Connector pins 31 are supported by guide member 30 and have one end 31b projecting within guide member 30 and the opposed end 31b projecting without guide member 30. Outside end portions 31a of connector pins 31 are arranged so that they may be surface packaged or mounted on a circuit substrate 32. The inner end portions 31b of connector pins 31 are resilient and bias chip carrier 49 in the direction of arrow D.

Positioning members 38 are provided within guide member 30 which cooperate with erroneous insertion preventive portions (notches) 49d provided on chip carrier 49 to prevent erroneous insertion of chip carrier 49 and determine the correct positioning of chip carrier 49 during insertion. Upper abutting portions 39 provided on guide member 30 restrain one end of chip carrier 49 which is urged upward by connector pins 31. Step portions 38a of positioning portions 38 also function as upper abutting portions.

Chip carrier 49 is inserted into guide member 31 by inserting chip carrier 49 in the direction of arrows E and F while guiding chip carrier 49 utilizing the lower abutting portions 37 of positioning portions 38. Chip carrier 49 is then slid in the direction of arrow F while strongly pushing it in opposition to the biasing force present in the direction of arrow D provided by the resilience of connector pins 31. Chip carrier 49 then becomes pinched between connector pins 31, upper abutting portions 39 and stepped portions 38a of positioning portions 38, thereby securing chip carrier 49 in place. Stepped portions 38a pass through erroneous insertion preventive portions (notches) 49d of the chip carrier when the chip carrier is first inserted in the direction of arrow E. Lower abutting portion 37, integrally formed with positioning portion 38, prevents destruction of connector pins 31 when chip carrier 49 is pushed during insertion by preventing chip carrier 49 from being pushed beyond the resiliency point of connector pins 31. Accordingly, a worker inserting chip carrier 49 may safely push chip carrier 49 because lower abutting portions 37 limit the distance of downward movement of chip carrier 49.

When chip carrier 49 is secured in place, it is secured between upper abutting portions 39 and step portion 38a on the hand, and the projecting ends 31b of connector pins 31 on the other hand. Upper abutting portions 39, positioning portions 38 and lower abutting portions 37 are molded integrally with guide member 30 or may be generally fabricated by injection molding using a plastic material.

By providing packaging of an IC chip such as a ROM in a microelectronic apparatus, supported within a fixed IC chip socket resiliently urged upward against an abutting portion, so that the IC chip may be interchangeably slid in and out of the socket, the packaging area can be saved, the IC may be easily interchanged and a very simple IC packaging method is realized.

In addition to the interchangeability of the IC chip, the present invention may also reduce the packaging area and the height of the package unit to dimensions attained when packaging a general IC of the flat package type and thus is particularly well-suited to small sized electronic apparatus which require a very high density packaging arrangement. Additionally, since the IC socket of the present invention may be integrally molded of a plastic material, it can be produced in large quantities at very low costs, thereby providing added utility.

It will thus be seen that the objects set forth above, among those made apparent from the preceding description, are additionally attained and since certain changes may be made in carrying out the above process and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all states of the scope of the invention which, as a matter of language, might be said to fall therebetween.

We claim:

1. A device for fixedly packaging an interchangeable IC on an electronic circuit substrate comprising:
   a chip carrier substrate upon which the IC is mounted, the chip carrier substrate having electrodes on the surface thereof;
   an IC bearing chip mounted on the chip carrier substrate and electrically connected with said electrode pattern; and
   an IC chip socket comprising a guide member formed with a central opening for receiving at least a portion of the chip carrier substrate and a plurality of connector pins supported by the guide member, each having one end extending within the central opening of the guide member for contact with and electrically coupling with the electrodes of the chip carrier substrate and a second end extending outside the guide member extending in a substantially transverse direction relative to the guide member for coupling to the electronic circuit substrate;
   whereby the chip carrier substrate is changeably mounted and the IC chip socket is surface mountable on the electronic circuit substrate.

2. A device for fixedly packaging an interchangeable IC on an electronic circuit substrate comprising:
   a chip carrier substrate upon which the IC is mounted, the chip carrier substrate having electrodes on the surface thereof;
   an IC bearing chip mounted on the chip carrier substrate and electrically connected with said electrode pattern; and
   an IC chip socket comprising a guide member formed with a central opening for receiving at least a portion of the chip carrier substrate and a plurality of connector pins supported by the guide member each having one end extending within the central opening of the guide member for contact with and electrically coupling with the electrodes of the chip carrier substrate and a second end extending outside the guide member for coupling to the electronic circuit substrate the connector pins being made of resilient material, and the ends of the connector pins projecting within the guide member are disposed opposed to the electrodes arranged on the surface of the chip carrier to bias the chip carrier to retain the chip carrier in the guide member;
   whereby the chip carrier substrate is changeably mounted and the IC chip socket is surface mountable on the electronic circuit substrate.

3. The device of claim 2, wherein the ends of the connector pins within the guide member are biased in the direction of the entrance to the opening in the guide member, said IC chip socket including an abutment member for pressing the chip carrier in a direction opposed to the biasing of the connector pins.

4. The device of claim 3, wherein the abutment member is integrally formed in the guide member.

5. The IC chip socket of claim 4, wherein the guide member and abutment member are formed of a plastic material.

6. The device of claim 3, wherein the abutment member is a separate member secured to the guide member.

7. The device of claim 6, wherein the abutment member has an opening defining the entrance to the opening of the guide member to permit insertion of the chip carrier therethrough and into an engaged position between the connector pins and abutment member.

8. The device of claim 4, wherein the abutment member is shaped to permit insertion of the chip carrier therepast into the opening in the guide member and into an engaged position between the connector pins and abutment member.

9. The IC chip socket of claim 2, wherein the connector pins are made of metal.

10. The IC chip socket of claim 2, wherein the inner surface of the opening of the guide member is formed with one of a convex or concave positioning portion and the periphery of the chip carrier is formed with the other of a convex or a concave positioning portion, the convex positioning portion and the concave positioning portion being asymmetrically located in a transverse plane in facing relation, whereby erroneous positioning of the chip carrier is prevented.

11. The device of claim 3, wherein the guide member is formed with a further abutment member to limit the displacement of the chip carrier into the opening of the guide member during insertion, whereby over-flexing and injury to the connector pins may be avoided.

12. The device of claim 3, wherein the electrodes are formed in at least two opposed side surfaces of the chip carrier for engagement by the ends of connector pins on at least two facing sides to position and return the chip carrier in the guide member.

13. The device of claim 2, and including encapsulation means covering the exposed surface of the chip positioned on the chip carrier, the electrodes being an electrode pattern.

14. An IC chip socket for fixedly mounting an interchangeable IC chip carrier utilized for packaging a chip carrier to an electronic circuit substrate, the IC chip carrier having electrodes on the surface thereof, comprising:
  a guide member formed with a central opening for receiving at least a portion of the chip carrier; and
  a plurality of connector pins supported by the guide member, each having one end extending within the central opening of the guide member for coupling with the electrodes of the chip carrier and a second end extending outside extending in a substantially transverse direction relative to the guide member, whereby the chip carrier is changeably mountable in the IC chip socket and the chip socket is surface mountable on an electronic circuit substrate.

15. An IC chip socket for fixedly mounting an interchangeable IC chip carrier utilized for packaging a chip carrier to an electronic circuit substrate, the IC chip carrier having electrodes on the surface thereof, comprising:
  a guide member formed with a central opening for receiving at least a portion of the chip carrier; and
  a plurality of connector pins supported by the guide member, each having one end extending within the central opening of the guide member for coupling with the electrodes of the chip carrier and a second end extending outside the guide member, whereby the chip carrier is changeably mountable in the IC chip socket and the chip socket is surface mountable on an electronic circuit substrate the connector pins being made of a resilient material, and the ends of the connector pins projecting within the guide member being disposed opposed to the electrodes arranged on the surface of the chip carrier to bias the chip carrier to retain the chip carrier in the guide member.

16. The IC chip socket of claim 15, wherein the ends of the connector pins within the guide member are biased in the direction of the entrance to the opening in the guide member, said IC chip socket including an abutment member for pressing the chip carrier in a direction opposed to the biasing of the connector pins.

17. The IC chip socket of claim 15, wherein the abutment member is integrally formed in the guide member.

18. The IC chip socket of claim 17, wherein the guide member and abutment member are formed of a plastic material.

19. The IC chip socket of claim 15, wherein the abutment member is a separate member secured to the guide member.

20. The IC chip socket of claim 19, wherein the abutment member has an opening defining the entrance to the opening of the guide member to permit insertion of the chip carrier therethrough and into an engaged position between the connector pins and abutment member.

21. The IC chip socket of claim 17, wherein the abutment member is shaped to permit insertion of the chip carrier therepast into the opening in the guide member and into an engaged position between the connector pins and abutment member.

22. The IC chip socket of claim 15, wherein the connector pins are made of metal.

23. The IC chip socket of claim 15, wherein the inner surface of the opening of the guide member is formed with one of a convex or concave positioning portion and the periphery of the chip carrier is formed with the other of a convex or a concave positioning portion, the convex positioning portion and the concave positioning portion being asymmetrically located in a transverse plane in facing relation, whereby erroneous positioning of the chip carrier is prevented.

24. The IC chip socket of claim 16, wherein the guide member is formed with a further abutment member to limit the displacement of the chip carrier into the opening of the guide member during insertion, whereby over-flexing and injury to the connector pins may be avoided.

25. The IC chip socket of claim 15, wherein the electrodes are formed in at least two opposed side surfaces of the chip carrier for engagement by the ends of connector pins on at least two facing sides to position and return the chip carrier in the guide member.

26. An IC chip socket for fixedly mounting on an electronic circuit substrate an interchangeable lead-less IC chip carrier having a plurality of electrodes on the surface thereof, comprising:
  a guide member formed with an internal opening for receiving and guiding the periphery of the IC chip carrier;

a plurality of connector pins supported by the guide member for electrically connecting the electrodes of the chip carrier with the electronic circuit substrate when the chip carrier is positioned within the guide member, each connector pin having an end extending within the opening in the guide member and an end extending outside the guide member;

a lower abutment member provided on the inner surface of the opening of the guide member for preventing damage to the connector pins when attaching the IC chip carrier while permitting the ends of the connector pins within the opening in the guide member to engage the electrodes in the surface of the chip carrier; and an upper abutment member for securing the IC chip carrier between the upper abutment member and the connector pins, wherein the connector pins bias the IC chip towards the upper abutment member, and the lower abutment member and the upper abutment member are integrally formed with the guide member.

27. The IC chip socket of claim 26, and including an erroneous insertion preventing portion formed on the periphery of the IC chip carrier, and a mating erroneous insertion preventing portion formed on the inner surface of the opening in the guide member for insuring proper positioning of the chip carrier.

28. The IC chip socket of claim 26, wherein the lower abutment limits the displacement of the chip carrier into the opening of the guide member during insertion.

29. The IC chip socket of claim 26, wherein the upper abutment member is formed with an opening defining the entrance to the opening in the guide member to permit insertion of the chip carrier therethrough, the chip carrier being laterally slidable between the connector pins and the upper abutment member, after insertion, to the operative position.

* * * * *